United States Patent
Huang (10) Patent No.: US 10,763,860 B2
(45) Date of Patent: Sep. 1, 2020

(54) DATA RETENTION CIRCUIT

(71) Applicant: Nuvoton Technology Corporation, Hsinchu Science Park (TW)

(72) Inventor: Chi-Ray Huang, Kaohsiung (TW)

(73) Assignee: NUVOTON TECHNOLOGY CORPORATION, Hsinchu Science Park (TW)

(\*) Notice: Subject to any disclaimer, the term of this patent is extended or adjusted under 35 U.S.C. 154(b) by 0 days.

(21) Appl. No.: 16/729,148

(22) Filed: Dec. 27, 2019

(65) Prior Publication Data

US 2020/0212912 A1  Jul. 2, 2020

(30) Foreign Application Priority Data

Dec. 28, 2018  (TW) .............................. 107147576 A (51) Int. Cl.
| | |
|---|---|
| *H03K 19/08* | (2006.01) |
| *H03K 19/094* | (2006.01) |
| *H03K 3/037* | (2006.01) |
| *H03K 17/30* | (2006.01) |
| *H03K 19/17772* | (2020.01) |

(52) U.S. Cl.
CPC ....... *H03K 19/0813* (2013.01); *H03K 3/0372* (2013.01); *H03K 17/302* (2013.01); *H03K 19/094* (2013.01); *H03K 19/17772* (2013.01)

(58) Field of Classification Search
CPC .......... H03K 3/02; H03K 3/027; H03K 3/037; H03K 3/0372; H03K 3/0375; H03K 17/30; H03K 17/302; H03K 19/02; H03K 19/08; H03K 19/0813
See application file for complete search history.

(56) References Cited

U.S. PATENT DOCUMENTS

| | | | | |
|---|---|---|---|---|
| 7,020,041 | B2* | 3/2006 | Somasekhar | G11C 5/143 365/189.06 |
| 8,018,788 | B2* | 9/2011 | Jung | G11C 11/413 365/154 |
| 9,490,807 | B2 | 11/2016 | Lau et al. | |
| 2002/0000834 | A1* | 1/2002 | Ooishi | H03K 3/012 326/113 |
| 2006/0152267 | A1 | 7/2006 | Ramprasad | |
| 2006/0206739 | A1* | 9/2006 | Kim | G11C 7/02 713/322 |

(Continued)

*Primary Examiner* — Jason Crawford
(74) *Attorney, Agent, or Firm* — Muncy, Geissler, Olds & Lowe, P.C.

(57) ABSTRACT

A data retention circuit includes a power switch, a first inverter and a second inverter. The power switch has a first connection terminal coupled to a power voltage, and a second connection terminal coupled to the first power terminal and a second power terminal of a second inverter. The second input terminal and the second output terminal of the second inverter are coupled to the first output terminal and the first input terminal of the first inverter, respectively. In a sleep mode, the power switch and the transistor are turned off, a first leakage current flows between the first connection terminal and the second connection terminal, a second leakage current flows between the first power terminal and the first output terminal, and the first and the second leakage currents form a steady-state voltage, higher than or equal to a data retention voltage, on a second connection terminal.

10 Claims, 4 Drawing Sheets

(56) References Cited

U.S. PATENT DOCUMENTS

| | | | |
|---|---|---|---|
| 2007/0103195 A1* | 5/2007 | Duk-Sohn | H03K 19/0016 326/41 |
| 2007/0176639 A1 | 8/2007 | Hoberman et al. | |
| 2008/0055966 A1* | 3/2008 | Ramaraju | G11C 5/14 365/154 |
| 2009/0189685 A1* | 7/2009 | Terzioglu | H03K 19/0016 327/544 |
| 2009/0207675 A1* | 8/2009 | Kengeri | G11C 5/147 365/189.14 |
| 2012/0008449 A1* | 1/2012 | Chuang | G11C 11/417 365/227 |
| 2014/0003181 A1* | 1/2014 | Wang | G11C 11/413 365/226 |
| 2014/0173317 A1* | 6/2014 | Shamanna | G06F 1/3275 713/340 |
| 2014/0210535 A1* | 7/2014 | Bartling | H03K 3/02 327/199 |
| 2018/0145663 A1* | 5/2018 | Agarwal | H03K 3/3562 |
| 2019/0385672 A1* | 12/2019 | Sinangil | G11C 11/418 |

* cited by examiner

DATA RETENTION CIRCUIT

CROSS-REFERENCE TO RELATED APPLICATION

This application claims the benefit of Taiwan Patent Application No. 107147576, filed on Dec. 28, 2018, in the Taiwan Intellectual Property Office, the disclosure of which is incorporated herein in its entirety by reference.

BACKGROUND OF THE INVENTION

1. Field of the Invention

The present invention relates to a data retention technology, and more particularly to a data retention circuit.

2. Description of the Related Art

In order to quickly perform pre-recovery work without resetting after power restoration, a digital system usually includes a data retention circuit to retain the data at the time instant of power-off.

Conventionally, the data retention circuit can be implemented by a master-slave flip-flop circuit. The master-slave flip-flop circuit can include a master latch and a slave latch. The master-slave flip-flop circuit is powered off, and even entering the sleep mode, the slave latch is not powered off, thereby retaining data in the slave latch with uninterrupted power.

However, the conventional data retention circuit consumes high retention power.

SUMMARY OF THE INVENTION

An objective of the present invention is to provide a data retention circuit to solve the conventional problem.

According to an embodiment, the present invention provides a data retention circuit comprising a first power switch, a first inverter and a second inverter. The first power switch has a first connection terminal coupled to the power voltage, and a second connection terminal. In a sleep mode, the first power switch is turned off and a first leakage current flows between the first connection terminal and the second connection terminal. The first inverter has a first input terminal, a first output terminal, and a first power terminal coupled to the second connection terminal. The first inverter comprises a first transistor, a first terminal of the first transistor is coupled to the first power terminal, and a second terminal of the first transistor is coupled to the first output terminal. In the sleep mode, the first transistor is turned off and a second leakage current flows between the first power terminal and the first output terminal. The second inverter has a second input terminal coupled to the first output terminal, a second output terminal coupled to the first input terminal, and a second power terminal coupled to the second connection terminal. The first leakage current and the second leakage current can form a steady-state voltage on the second connection terminal, and the steady-state voltage is higher than or equal to a data retention voltage.

According to an embodiment, the present invention provides a data retention circuit comprising a first power switch, a first inverter, and a second inverter. The first power switch has a first connection terminal coupled to the ground voltage, and a second connection terminal. In a sleep mode, the first power switch is turned off and a first leakage current flows between the first connection terminal and the second connection terminal. The first inverter has a first input terminal, a first output terminal, and a first power terminal coupled to the second connection terminal. The first inverter comprises a first transistor having a first terminal coupled to the first power terminal, and a second terminal coupled to the first output terminal, wherein in the sleep mode, the first transistor is turned off and a second leakage current between the first power terminal and the first output terminal. The second inverter has a second input terminal coupled to the first output terminal, a second output terminal coupled to the first input terminal, and a second power terminal coupled to the second connection terminal. The first leakage current and the second leakage current can form a steady-state voltage on the second connection terminal, and the steady-state voltage is lower than the data retention voltage.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be acknowledged to imply the inclusion of stated elements but not the exclusion of any other elements.

Figure 1:
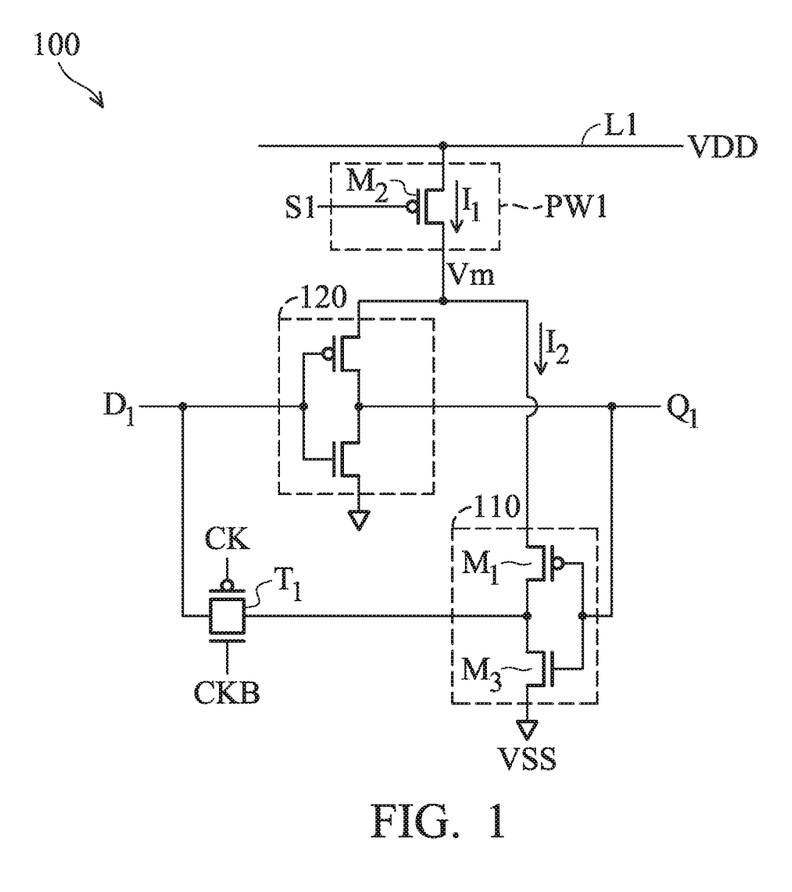
FIG. 1 is a schematic view of a first embodiment of a data retention circuit of the present invention.
Figure 2:
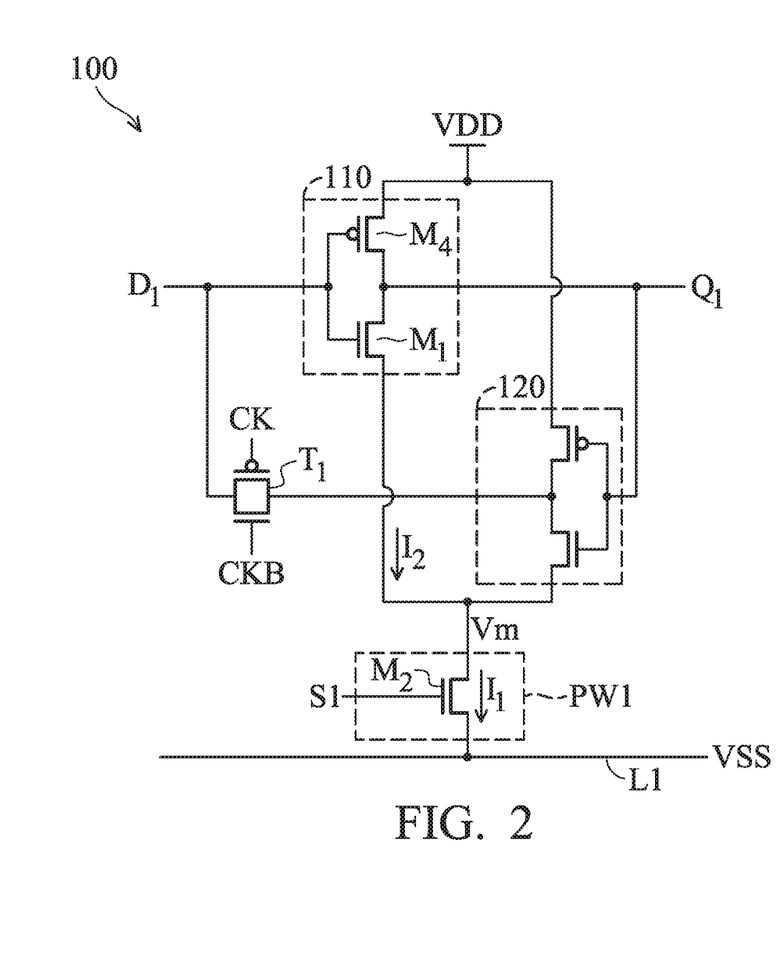
FIG. 2 is a schematic view of a second embodiment of a data retention circuit of the present invention.

FIGS. 1 and 2 are schematic views of a first embodiment and a second embodiment of a data retention circuit of the present invention, respectively. Please refer to FIGS. 1 and 2, a data retention circuit 100 can have two operation modes including a work mode and a sleep mode, and the data retention circuit 100 can be switched between the work mode and the sleep mode according to a switching signal S1. The data retention circuit 100 can retain data in the sleep mode, and then continue to operate according to the retained data when being switched back to the work mode. The operation of the data retention circuit 100 in the sleep mode will be described in following paragraphs. The operation of the data retention circuit 100 in the work mode is well known to those skilled in the art, so detailed description of the operation of the work mode is not repeated herein.

The data retention circuit 100 can include a first power switch PW1, a first inverter 110 and a second inverter 120. The first power switch PW1 is coupled to a first inverter 110 and a second inverter 120, and the first inverter 110 is cross-coupled to the second inverter 120.

The first power switch PW1 can include a first connection terminal, a second connection terminal, and a first control terminal. The first connection terminal of the first power switch PW1 is coupled to a power line L1, and the first control terminal of the first power switch PW1 is configured to receive a switching signal S1 and control electrical connection between the first connection terminal and the second connection terminal according to the switching signal S1. The switching signal S1 is used to switch the operation modes of the data retention circuit 100. For example, when the first power switch PW1 is turned on by switching signal S1, the data retention circuit 100 is powered on and enters the work mode; when the first power switch PW1 is turned off by the switching signal S1, the data retention circuit 100 is powered off and enters the sleep mode.

The first inverter 110 includes a first input terminal, a first output terminal and a first power terminal, and the second inverter 120 includes a second input terminal, a second output terminal and a second power terminal. The first power terminal of the first inverter 110 and the second power terminal of the second inverter 120 are coupled to the second connection terminal of the first power switch PW1.

The first inverter 110 includes a first transistor M1, which has a first terminal, a second terminal and a control terminal. The first terminal of the first transistor M1 is coupled to the first power terminal of the first inverter 110, the second terminal of the first transistor M1 is coupled to the first output terminal of the first inverter 110, and the control terminal of the first transistor M1 is coupled to the first input terminal of the first inverter 110.

When the first power switch PW1 is turned off by the switching signal S1, the data retention circuit 100 enters the sleep mode. At this time, the first power switch PW1 is turned off, but there still is a first leakage current I1 flowing between the first connection terminal and the second connection terminal of the first power switch PW1. Furthermore, when the first power switch PW1 is turned off and the first transistor M1 of the first inverter 110 is also turned off by the signal received at the first input terminal of the first inverter 110, the first transistor M1 is turned off, but in fact there still is a second leakage current I2 flowing between the first terminal and the second terminal of the first transistor M1, which are the first power terminal and the first output terminal of the first inverter 110. The first leakage current I1 and the second leakage current I2 flowing through the second connection terminal of the first power switch PW1 where the first power switch PW1 and the first inverter 110 are connected, are in an input-output relationship, and as a result, when reaching a steady state, the first leakage current I1 and the second leakage current I2 can form a steady-state voltage Vm on the second connection terminal of the first power switch PW1.

Please refer to FIG. 1. In a first embodiment, the power line L1 can apply a power voltage VDD, and the first connection terminal of the first power switch PW1 can be coupled to the power voltage VDD through the power line L1. At this time, the first power switch PW1 can be referred as a header power switch. Furthermore, the second input terminal of the second inverter 120 and the first output terminal of the first inverter 110 are coupled to input data D1, and the second output terminal of the second inverter 120 and the first input terminal of the first inverter 110 are coupled to output data Q1. The output data Q1 is inversed to the input data D1 because of the logical operation function of the second inverter 120. In some implementations, the power voltage VDD can be, but not limited to, 1.2 volts (V).

In some implementations, the first power switch PW1 can include a second transistor M2. The second transistor M2 has a first terminal coupled to the first connection terminal of the first power switch PW1, a second terminal coupled to the second connection terminal of the first power switch PW1, and a control terminal coupled to the control terminal of the first power switch PW1. The first connection terminal of the second transistor M2 can be coupled to the power voltage VDD through the power line L1.

In a first embodiment, the first transistor M1 of the first inverter 110 can be a P-type transistor. Furthermore, the first inverter 110 can include a N-type transistor M3. The N-type transistor M3 has a first terminal coupled to a ground voltage VSS, a second terminal coupled to the first output terminal of the first inverter 110, and a control terminal coupled to the first input terminal of the first inverter 110. When the output data Q1 received by the first input terminal of the first inverter 110 is at a high logical level when the first power switch PW1 is turned off (that is, the data retention circuit 100 enters the sleep mode), the first transistor M1 is turned off and the N-type transistor M3 is turned on, and the first output terminal of the first inverter 110 generates the input data D1 with a low logical level.

In a first embodiment, the second transistor M2 is a P-type transistor and the switching signal S1 is at the high logical level, so that the second transistor M2 is turned off and the data retention circuit 100 enters the sleep mode. In the sleep mode, the second transistor M2 of the first power switch PW1 is turned off but there still is the first leakage current I1 flowing from the first terminal of the second transistor M2 to the second terminal of the second transistor M2. Furthermore, when the first power switch PW1 is turned off and the output data Q1 is at the high logical level, the first transistor M1 of the first inverter is turned off but there still is the second leakage current I2 flowing from the first terminal of the first transistor M1 to the second terminal of the first transistor M1. In other words, the first leakage current I1 can flow into the second connection terminal of the first power switch PW1, and the second leakage current I2 can flow out of the second connection terminal of the first power switch PW1, and when the first leakage current I1 and the second leakage current I2 reach the steady state at the second connection terminal of the first power switch PW1, the steady-state voltage Vm can be formed on the second connection terminal of the first power switch PW1.

In the first embodiment, the power supply is stopped in the sleep mode because the first power switch PW1 is turned off, but as long as the steady-state voltage Vm formed by the first leakage current I1 and second leakage current I2 can be higher than or equal to a minimal data retention voltage required for the data retention circuit 100 to retain the data, the high logical level of the output data Q1 can be kept, in other word, the data is not lost, so that the output data Q1 with the high logical level can be retained to cause the first inverter 110 to generate the input data D1 with the low logical level at the first output terminal thereof, thereby achieving data retention function. As a result, the steady-state voltage Vm must be high enough to turn on at least the transistor of the second inverter 120 coupled to the second connection terminal of the first power switch PW1, to keep the high logical level of the output data Q1. In other words, the minimal data retention voltage is the minimum voltage required to turn the transistor on.

In some implementations, the minimal data retention voltage can be substantially in a range of 0.25 volts and 0.4 volts, but the present invention is not limited thereto, and the minimal data retention voltage can depend on the integrated circuit process and a W/L ratio of the transistor.

In the first embodiment, the steady-state voltage Vm is lower than the power voltage VDD and the first power switch PW1 can provide larger resistance between the power voltage VDD and the first terminal of the first transistor M1, so the power consumption caused by leakage current of the data retention circuit 100 can be reduced. In some implementations, the steady-state voltage Vm can be as close as possible to the minimal data retention voltage, thereby maximally reducing the power consumption of leakage current and achieving the data retention function at the same time. As a result, the data retention circuit 100 of the embodiment of the present invention can retain the data in the sleep mode, and can greatly reduce the retention power required to retain the data.

In the first embodiment, a threshold voltage of the second transistor M2 can be lower than a threshold voltage of the first transistor M1, and a W/L ratio of the second transistor M2 can be substantially equal to the W/L ratio of the first transistor M1. The first leakage current I1 can be higher than the second leakage current I2, so that the steady-state voltage Vm formed on the second connection terminal of first power switch PW1 can be higher than or equal to the minimal data retention voltage. In some implementations, the power consumption of the leakage current can be reduced by about 50% to 80%.

In the first embodiment, the threshold voltage of the second transistor M2 can be substantially equal to the threshold voltage of the first transistor M1, and the W/L ratio of the second transistor M2 can be higher than the W/L ratio of the first transistor M1. The first leakage current I1 can be higher than the second leakage current I2, so that the steady-state voltage Vm formed on the second connection terminal of first power switch PW1 can be higher than or equal to the minimal data retention voltage. In some implementations, a ratio of the W/L ratio of the second transistor M2 to the W/L ratio of the first transistor M1 can be in a range of 3 to 4.

In the first embodiment, the data retention circuit 100 can include a first transmission gate T1. The first transmission gate T1 can include a first connection terminal and a second connection terminal. The first connection terminal of the first transmission gate T1 is coupled to the first output terminal of the first inverter 110, and the second connection terminal of the first transmission gate T1 is coupled to the second input terminal of the second inverter 120. The first transmission gate T1 is controlled by a clock signal CK and a clock signal CKB, and the first transmission gate T1 can build or cut off the electrical connection between the first output terminal of the first inverter 110 and the second input terminal of the second inverter 120 according to the clock signal CK and the clock signal CKB. The clock signal CK and the clock signal CKB are inverse to each other. In the sleep mode, the clock signal CK can be kept at the low logical level and the clock signal CKB can be kept at the high logical level, for turning on the first transmission gate T1.

Figure 3:
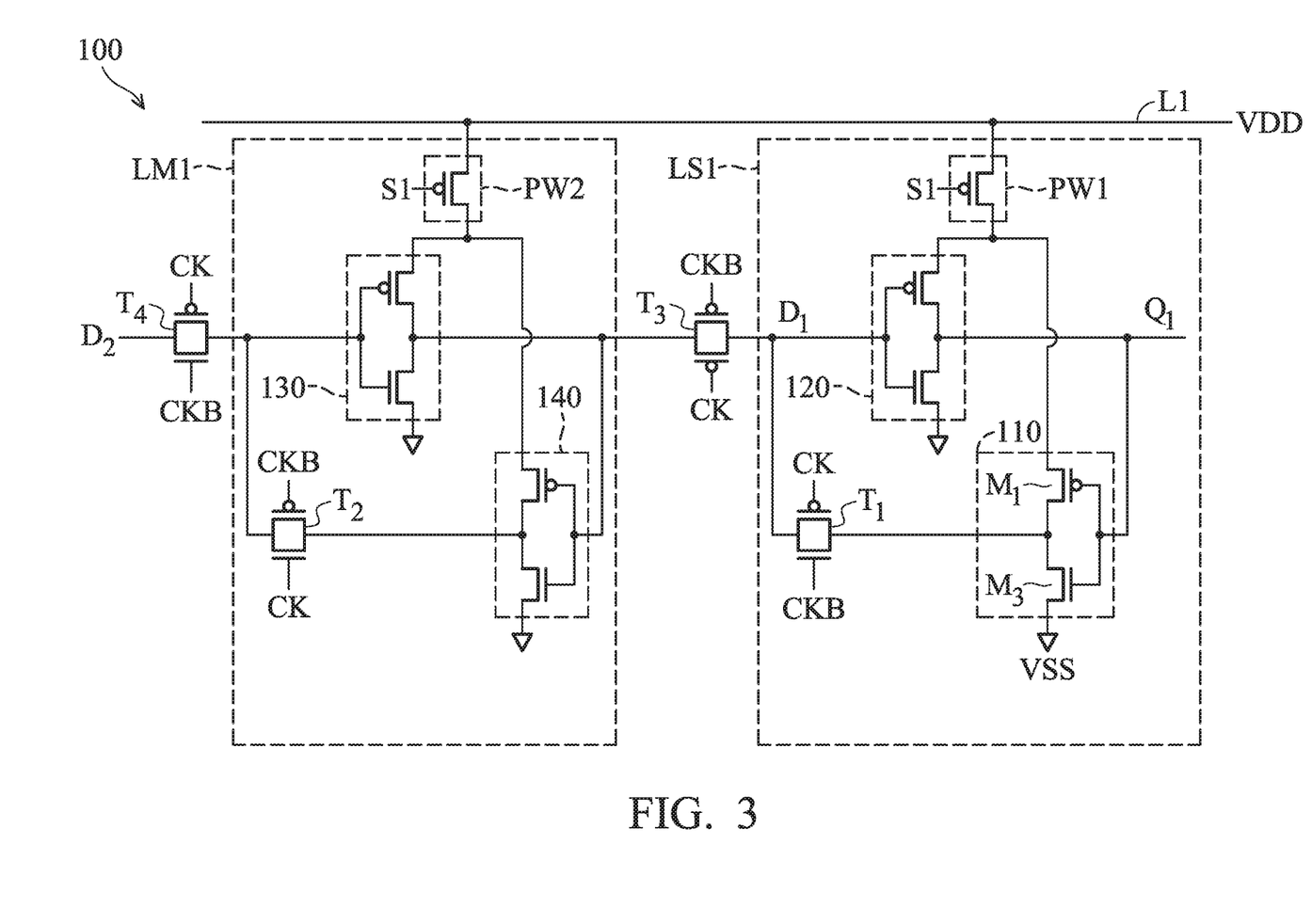
FIG. 3 is a schematic view of an implementation of the first embodiment of the data retention circuit of the present invention.

FIG. 3 is a schematic view showing an implementation of the first embodiment of the data retention circuit of the present invention. Please refer to FIG. 3, in the implementation of the first embodiment, the first power switch PW1, the first inverter 110, the second inverter 120 and the first transmission gate T1 can form a latch, which can be referred as a slave latch LS1 hereinafter. The data retention circuit 100 can include a second power switch PW2, a third inverter 130, a fourth inverter 140 and a second transmission gate T2. The second power switch PW2, the third inverter 130, the fourth inverter 140 and the second transmission gate T2 can form a latch, which can be referred as a master latch LM1 hereafter. Furthermore, the data retention circuit 100 can include a third transmission gate T3 and a fourth transmission gate T4. The third transmission gate T3 is coupled between the third inverter 130 and the second inverter 120, and the fourth transmission gate T4 is coupled between input data D2 and the third inverter 130.

In an implementation of the first embodiment, the second power switch PW2 can has a third connection terminal, a fourth connection terminal and a second control terminal. The third connection terminal of the second power switch PW2 is coupled to the power line L1, and the second control terminal of the second power switch PW2 is coupled to the switching signal S1 and configured to control the electrical connection between the third connection terminal and the fourth connection terminal according to the switching signal S1. The switching signal S1 can be used to make the data retention circuit 100 enter the work mode by turning on the second power switch PW2, and make the data retention circuit 100 enter the sleep mode by turning off the second power switch PW2. In the sleep mode, the first power switch PW1 and the second power switch PW2 are turned off.

The third inverter 130 can include a third input terminal, a third output terminal and a third power terminal, and the fourth inverter 140 can include a fourth input terminal, a fourth output terminal and a fourth power terminal. The third power terminal of the third inverter 130 and the fourth power terminal of the fourth inverter 140 are coupled to the second connection terminal of the second power switch PW2. The fourth input terminal of the fourth inverter 140 is coupled to the third output terminal of the third inverter 130, and the fourth output terminal of the fourth inverter 140 is coupled to the third input terminal of the third inverter 130. The second transmission gate T2 can include a third connection terminal and a fourth connection terminal. The third connection terminal of the second transmission gate T2 is coupled to the fourth output terminal of the fourth inverter 140, the fourth connection terminal of the second transmission gate T2 is coupled to the third input terminal of the third inverter 130, and the second transmission gate T2 is controlled by the clock signal CK and the clock signal CKB to build or cut off the electrical connection between the fourth output terminal of the fourth inverter 140 and the third input terminal of the third inverter 130 according to the clock signal CK and the clock signal CKB.

Furthermore, the third transmission gate T3 can include a fifth connection terminal and a sixth connection terminal, and the fourth transmission gate T4 can include a seventh connection terminal and an eighth connection terminal. The fifth connection terminal of the third transmission gate T3 is coupled to the third output terminal of the third inverter 130, and the sixth connection terminal of the third transmission gate T3 is coupled to the second input terminal of the second inverter 120 to build or cut off the electrical connection between the third output terminal of the third inverter 130 and the second input terminal of the second inverter 120 according to the clock signal CK and the clock signal CKB. The seventh connection terminal of the fourth transmission gate T4 is coupled to the input data D2, and the eighth connection terminal of the fourth transmission gate T4 is coupled to the third input terminal of the third inverter 130 to build or cut off the electrical connection between the input data D2 and the third input terminal of the third inverter 130 according to the clock signal CK and the clock signal CKB. The input data D2 and the input data D1 can be data values of the same input signal at different time instances, and the time instance of the input data D2 is later than the time instance of the input data D1.

In the implementation of the first embodiment, the clock signal CK is kept at the low logical level in the sleep mode and the clock signal CKB is kept at the high logical level in the sleep mode, so the first transmission gate T1 and the fourth transmission gate T4 are turned on, and the second transmission gate T2 and the third transmission gate T3 are turned off.

In the implementation of the first embodiment, the fourth transmission gate T4, the master latch, the third transmission gate T3 and the slave latch can form a master-slave flip-flop circuit. In another embodiment, the data retention circuit 100 can include multiple master-slave flip-flop circuits. The master latches LM1 of the master-slave flip-flop circuit can share the same second power switch PW2 to achieve a power sharing function, and the first power switches PW1 of the slave latches LS1 of the master-slave flip-flop circuits are independent from each other and not share with each other.

Please refer to FIG. 2, in the second embodiment, the power line L1 can apply a ground voltage VSS. The first connection terminal of the first power switch PW1 can be coupled to the ground voltage VSS through the power line L1, so that the first connection terminal of second transistor M2 can be coupled to the ground voltage VSS through the power line L1. In this embodiment, the first power switch PW1 can be referred as a footer power switch. Furthermore, the first input terminal of the first inverter 110 and the second output terminal of the second inverter 120 are coupled to the input data D1, and the first output terminal of the first inverter 110 and the second input terminal of the second inverter 120 are coupled to the output data Q1. The output data Q1 is inverse to the input data D1 because of the logical operation function of the first inverter 110. In some implementations, the ground voltage VSS is, but is not limited to, zero volt.

In the second embodiment, the first transistor M1 of the first inverter 110 can be a N-type transistor. Furthermore, the first inverter 110 can include a P-type transistor M4. The first terminal of the P-type transistor M4 is coupled to the power voltage VDD, the second terminal of the P-type transistor M4 is coupled to the first output terminal of the first inverter 110, and the control terminal of the P-type transistor M4 is coupled to the first input terminal of the first inverter 110. When the input signal D1 received by the first input terminal of the first inverter 110 is at the low logical level (that is, when the data retention circuit enters the sleep mode) when the first power switch PW1 is turned off, the first transistor M1 is turned off and the P-type transistor M4 is turned on, and the first output terminal of the first inverter 110 generates the output data Q1 with the high logical level.

In the second embodiment, the second transistor M2 can be a N-type transistor, and the switching signal S1 can be at the low logical level to turn off second transistor M2, so that the data retention circuit 100 can be operated in the sleep mode. In the sleep mode, the second transistor M2 of the first power switch PW1 is turned off, but there still is a first leakage current I1 flowing from the second terminal of the second transistor M2 to the first terminal of the second transistor M2. Furthermore, when the first power switch PW1 is turned off and the input data D1 is at the low logical level, the first transistor M1 of the first inverter 110 is turned off, but there still is a second leakage current I2 flowing from the second terminal of the first transistor M1 to the first terminal of the first transistor M1. In other words, the first leakage current I1 flows out of the second connection terminal of the first power switch PW1, and the second leakage current I2 flows into the second connection terminal of the first power switch PW1. When the first leakage current I1 and the second leakage current I2 reach a steady state at the second connection terminal of first power switch PW1, a steady-state voltage Vm can be formed on the second connection terminal of the first power switch PW1.

In the second embodiment, the power supply is turned off in the sleep mode because the first power switch PW1 is turned off, but as long as the steady-state voltage Vm formed by the first leakage current I1 and the second leakage current I2 is lower than the maximal data retention voltage required by the data retention circuit 100 to retain the data, the low logical level of the input data D1 can be kept to ensure that the data is not lost, and the input data D1 with the low logical level can be retained to cause the first inverter 110 to generate the output data Q1 with the high logical level at the first output terminal thereof, thereby achieving data retention function. The steady-state voltage Vm must be high enough to turn on at least the transistor of the second inverter 120 coupled to the second connection terminal of the first power switch PW1, so as to keep the low logical level of the input data D1. In other words, the maximal data retention voltage is the maximal voltage required to turn the transistor on.

In some implementations, the maximal data retention voltage can be substantially in a range of the power voltage VDD minus 0.4 volts to the power voltage VDD minus 0.25 volts, but the present invention is not limited thereto. In an embodiment, the maximal data retention voltage can depend on the integrated circuit process and the W/L ratio of the transistor.

In the second embodiment, because the steady-state voltage Vm is higher than the ground voltage VSS and the first power switch PW1 forms larger resistance between the ground voltage VSS and the first terminal of the first transistor M1, so the power consumption caused by leakage current of the data retention circuit 100 can be reduced. In some implementations, the steady-state voltage Vm can be as close as possible to the maximal data retention voltage, so as to maximally reduce the power consumption of leakage current and achieve the data retention function. As a result, the data retention circuit 100 of the embodiment of the present invention can retain the data in the sleep mode and also greatly reduce the retention power required to retain the data.

In the second embodiment, the threshold voltage of the second transistor M2 can be lower than the threshold voltage of the first transistor M1, and the W/L ratio of the second transistor M2 can be substantially equal to the W/L ratio of the first transistor M1. The first leakage current I1 can be higher than the second leakage current I2, so that the steady-state voltage Vm formed on the second connection terminal of first power switch PW1 can be lower than the maximal data retention voltage.

In the second embodiment, the threshold voltage of the second transistor M2 can be substantially equal to the threshold voltage of the first transistor M1, and the W/L ratio of the second transistor M2 can be higher than the W/L ratio of the first transistor M1. The first leakage current I1 can be higher than the second leakage current I2, so that the steady-state voltage Vm formed on the second connection terminal of first power switch PW1 can be lower than the maximal data retention voltage. In some implementations, a ratio of the W/L ratio of the second transistor M2 to the W/L ratio of the first transistor M1 can be in a range of 3 to 4.

In the second embodiment, the data retention circuit 100 can include a first transmission gate T1. The first transmission gate T1 has a first connection terminal and a second connection terminal. The first connection terminal of the first transmission gate T1 is coupled to the second output terminal of the second inverter 120, and the second connection terminal of the first transmission gate T1 is coupled to the first input terminal of the first inverter 110. The first transmission gate T1 is controlled by the clock signal CK and the clock signal CKB, and the first transmission gate T1 can build or cut off the electrical connection between the first output terminal of the first inverter 110 and the second input terminal of the second inverter 120 according to the clock signal CK and the clock signal CKB. The clock signal CK and the clock signal CKB are inverse to each other. In the sleep mode, the clock signal CK is kept at the low logical level, and the clock signal CKB is kept at the high logical level, so as to turn on the first transmission gate T1.

Figure 4:
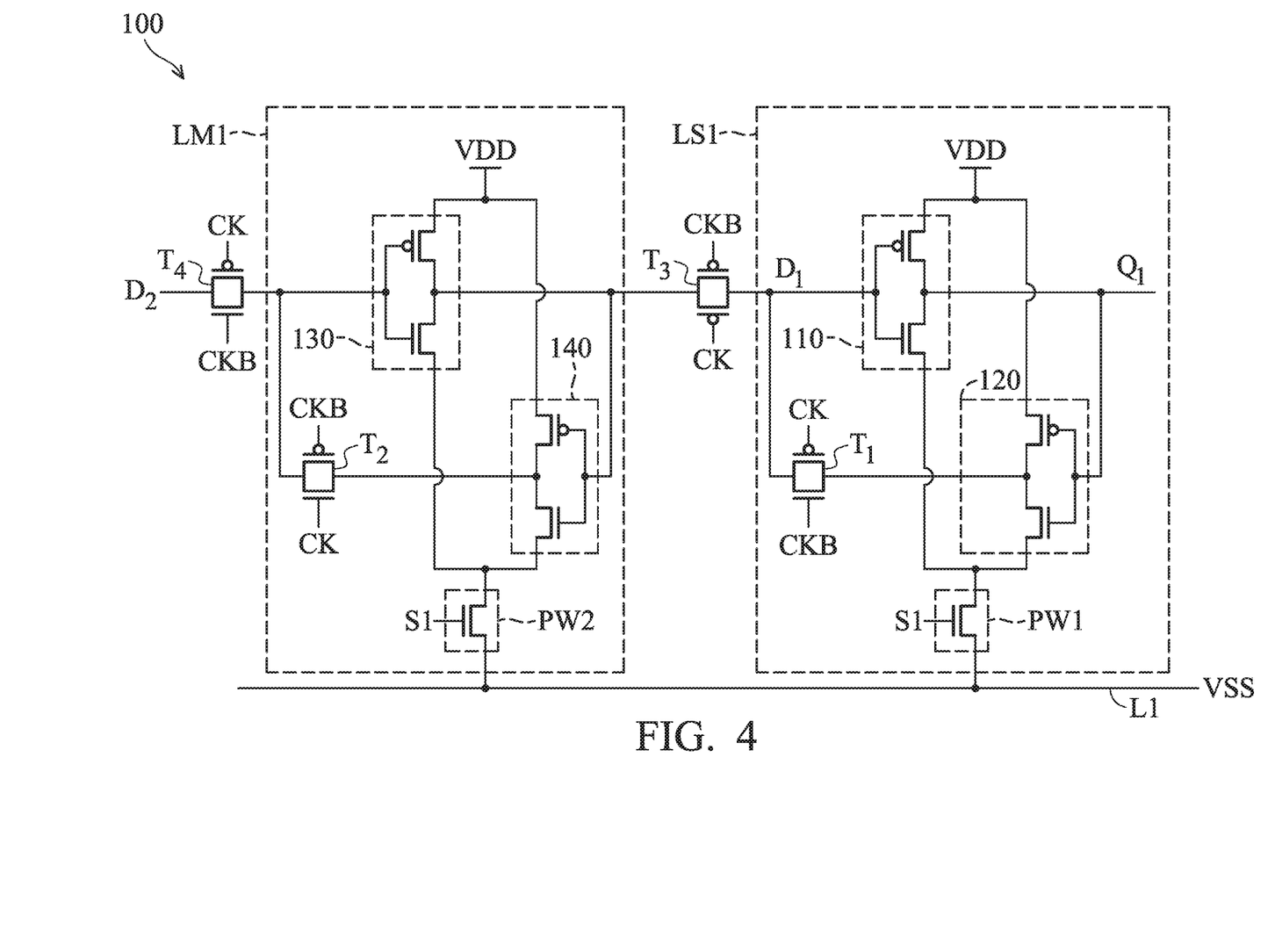
FIG. 4 is a schematic view of an implementation of the second embodiment of the data retention circuit of the present invention.

FIG. 4 is a schematic view of implementation of a second embodiment of a data retention circuit of the present invention. Please refer to FIG. 4, in implementation of the second embodiment, the first power switch PW1, the first inverter 110, the second inverter 120 and the first transmission gate T1 can form the latch, which can be referred as a slave latch LS1 hereinafter. The data retention circuit 100 can include a second power switch PW2, a third inverter 130, a fourth inverter 140 and a second transmission gate T2. The second power switch PW2, the third inverter 130, the fourth inverter 140 and the second transmission gate T2 can form another latch, which can be referred as a master latch LM1 hereafter. Furthermore, the data retention circuit 100 can include a third transmission gate T3 and a fourth transmission gate T4. The third transmission gate T3 is coupled between the third inverter 130 and the first inverter 110, and the fourth transmission gate T4 is coupled between the input data D2 and the third inverter 130.

In the implementation of the second embodiment, the second power switch PW2 has a third connection terminal, a fourth connection terminal and a second control terminal. The third connection terminal of the second power switch PW2 is coupled to the power line L1, and the second control terminal of the second power switch PW2 is coupled to the switching signal S1 and configured to control the electrical connection between the third connection terminal and the fourth connection terminal according to the switching signal S1. The switching signal S1 can be used to turn on the second power switch PW2 to make the data retention circuit 100 enter the work mode, or turn off the second power switch PW2 to make the data retention circuit 100 enter the sleep mode. In the sleep mode, the first power switch PW1 and the second power switch PW2 are turned off.

The third inverter 130 has a third input terminal, a third output terminal and a third power terminal, and the fourth inverter 140 has a fourth input terminal, a fourth output terminal and a fourth power terminal. The third power terminal of the third inverter 130 and the fourth power terminal of the fourth inverter 140 are coupled to the second connection terminal of the second power switch PW2, and the fourth input terminal of the fourth inverter 140 is coupled to the third output terminal of the third inverter 130, and the fourth output terminal of the fourth inverter 140 is coupled to the third input terminal of the third inverter 130. The second transmission gate T2 has a third connection terminal and a fourth connection terminal. The third connection terminal of the second transmission gate T2 is coupled to the fourth output terminal of the fourth inverter 140, the fourth connection terminal of the second transmission gate T2 is coupled to the third input terminal of the third inverter 130, and the second transmission gate T2 is controlled by the clock signal CK and the clock signal CKB, to build or cut off the electrical connection between the fourth output terminal of the fourth inverter 140 and the third input terminal of the third inverter 130 according to the clock signal CK and the clock signal CKB.

Furthermore, the third transmission gate T3 has a fifth connection terminal and a sixth connection terminal, and the fourth transmission gate T4 has a seventh connection terminal and an eighth connection terminal. The fifth connection terminal of the third transmission gate T3 is coupled to the third output terminal of the third inverter 130, and the sixth connection terminal of the third transmission gate T3 is coupled to the first input terminal of the first inverter 110 and configured to build or cut off the electrical connection between the third output terminal of the third inverter 130 and the first input terminal of the first inverter 110 according to the clock signal CK and the clock signal CKB. The seventh connection terminal of the fourth transmission gate T4 is coupled to the input data D2, and the eighth connection terminal of the fourth transmission gate T4 is coupled to the third input terminal of the third inverter 130 and configured to build or cut off the electrical connection between the input data D2 and the third input terminal of the third inverter 130 according to the clock signal CK and the clock signal CKB. The input data D2 and the input data D1 are the data values of the same input signal at different time instances, and the time instance of the input data D2 is later than the time instance of the input data D1.

In the implementation of the second embodiment, since the clock signal CK is kept at the low logical level and the clock signal CKB is kept at the high logical level in the sleep mode, the first transmission gate T1 and the fourth transmission gate T4 can be turned on, and the second transmission gate T2 and the third transmission gate T3 are turned off.

In the implementation of the second embodiment, the fourth transmission gate T4, the master latch, the third transmission gate T3 and the slave latch can form a master-slave flip-flop circuit. In another embodiment, the data retention circuit 100 can include multiple master-slave flip-flop circuits. The master latches LM1 of the master-slave flip-flop circuits can share the same second power switch PW2 to achieve power sharing function, and the first power switches PW1 of the slave latches LS1 of the master-slave flip-flop circuits are independent from each other and not shared with each other.

According to above-mentioned contents, an embodiment of the present invention provides the data retention circuit which can use the first leakage current generated when the first power switch is turned off and the second leakage current generated when the first transistor of the first inverter is turn off, to form the steady-state voltage required for retaining the data in the sleep mode, so as to retain data. Furthermore, because of the high resistance of the first transistor, the power consumption caused by the leakage current of the data retention circuit can be reduced. As a result, the data retention circuit of any embodiment of the present invention can retain data in the sleep mode and also greatly reduce the retention power required to retain the data.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A data retention circuit, comprising:
    a first power switch having a first connection terminal coupled to a power voltage, and a second connection terminal, wherein in a sleep mode, the first power switch is turned off and a first leakage current flows between the first connection terminal and the second connection terminal;
    a first inverter having a first input terminal, a first output terminal, and a first power terminal coupled to the second connection terminal, wherein the first inverter comprises a first transistor, and a first terminal of the first transistor is coupled to the first power terminal, and a second terminal of the first transistor is coupled to the first output terminal, wherein in the sleep mode, the first transistor is turned off and a second leakage current flows between the first power terminal and the first output terminal; and
    a second inverter having a second input terminal coupled to the first output terminal, a second output terminal coupled to the first input terminal, and a second power terminal coupled to the second connection terminal;
    wherein the first leakage current and the second leakage current form a steady-state voltage on the second connection terminal, and the steady-state voltage is higher than or equal to a data retention voltage.

2. The data retention circuit according to claim 1, wherein the first power switch comprises a second transistor having a threshold voltage lower than a threshold voltage of the first transistor, and a W/L ratio of the second transistor is equal to a W/L ratio of the first transistor.

3. The data retention circuit according to claim 1, wherein the first power switch comprises a second transistor having a threshold voltage equal to a threshold voltage of the first transistor, and a W/L ratio of the second transistor is higher than a W/L ratio of the first transistor.

4. The data retention circuit according to claim 3, wherein a ratio of the W/L ratio of the second transistor to the W/L ratio of the first transistor is in range of 3 to 4.

5. The data retention circuit according to claim 1, further comprising:
    a second power switch having a third connection terminal coupled to the power voltage, and a fourth connection terminal, wherein the second power switch is turned off in the sleep mode;
    a third inverter having a third input terminal, a third output terminal and a third power terminal coupled to the fourth connection terminal; and
    a fourth inverter having a fourth input terminal coupled to the third output terminal, a fourth output terminal coupled to the third input terminal, and a fourth power terminal coupled to the fourth connection terminal;
    a first transmission gate coupled between the first output terminal and the second input terminal;
    a second transmission gate coupled between the third input terminal and the fourth output terminal;
    a third transmission gate coupled between the third output terminal and the second input terminal; and
    a fourth transmission gate coupled between input data and the third input terminal.

6. A data retention circuit, comprising:
    a first power switch having a first connection terminal coupled to a ground voltage, and a second connection terminal, wherein in a sleep mode, the first power switch is turned off and a first leakage current flows between the first connection terminal and the second connection terminal;
    a first inverter having a first input terminal, a first output terminal, and a first power terminal coupled to the second connection terminal, wherein the first inverter comprises a first transistor having a first terminal coupled to the first power terminal, and a second terminal coupled to the first output terminal, wherein in the sleep mode, the first transistor is turned off and a second leakage current flows between the first power terminal and the first output terminal; and
    a second inverter having a second input terminal coupled to the first output terminal, a second output terminal coupled to the first input terminal, and a second power terminal coupled to the second connection terminal;
    wherein the first leakage current and the second leakage current form a steady-state voltage on the second connection terminal, and the steady-state voltage is lower than the data retention voltage.

7. The data retention circuit according to claim 6, wherein the first power switch comprises a second transistor having a threshold voltage lower than a threshold voltage of the first transistor, and a W/L ratio of the second transistor is equal to a W/L ratio of the first transistor.

8. The data retention circuit according to claim 6, wherein the first power switch comprises a second transistor having a threshold voltage equal to a threshold voltage of the first transistor, and a W/L ratio of the second transistor is higher than a W/L ratio of the first transistor.

9. The data retention circuit according to claim 8, wherein a ratio of the W/L ratio of the second transistor to the W/L ratio of the first transistor is in range of 3 to 4.

10. The data retention circuit according to claim 6, further comprising:

a second power switch having a third connection terminal coupled to the ground voltage, and a fourth connection terminal, wherein the second power switch is turned off in the sleep mode;

a third inverter having a third input terminal, a third output terminal, and a third power terminal coupled to the fourth connection terminal; and a fourth inverter having a fourth input terminal coupled to the third output terminal, a fourth output terminal coupled to the third input terminal, and a fourth power terminal coupled to the fourth connection terminal;

a first transmission gate coupled between the second output terminal and the first input terminal;

a second transmission gate coupled between the third input terminal and the fourth output terminal;

a third transmission gate coupled between the third output terminal and the first input terminal; and a fourth transmission gate coupled between the input data and the third input terminal.

* * * * *